(12) United States Patent
Gao

(10) Patent No.: US 11,924,999 B2
(45) Date of Patent: Mar. 5, 2024

(54) SYMMETRICAL DUAL FLUID DISTRIBUTION UNIT FOR SERVER RACK

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 180 days.

(21) Appl. No.: 17/483,704

(22) Filed: Sep. 23, 2021

(65) Prior Publication Data
US 2023/0089909 A1  Mar. 23, 2023

(51) Int. Cl.
H05K 7/20 (2006.01)

(52) U.S. Cl.
CPC ..... *H05K 7/20272* (2013.01); *H05K 7/20781* (2013.01)

(58) Field of Classification Search
None
See application file for complete search history.

(56) References Cited

U.S. PATENT DOCUMENTS

| | | | |
|---|---|---|---|
| 5,954,127 A * | 9/1999 | Chrysler | F25B 41/24 165/170 |
| 10,905,031 B1 * | 1/2021 | Gao | G06F 1/184 |
| 11,019,752 B2 * | 5/2021 | Gao | H05K 7/20272 |
| 11,129,292 B1 * | 9/2021 | Shao | H05K 7/1485 |
| 11,547,022 B2 * | 1/2023 | Gao | H05K 7/20272 |
| 11,606,885 B2 * | 3/2023 | Gao | H05K 7/20781 |
| 2022/0071063 A1 * | 3/2022 | Heydari | H05K 7/20836 |
| 2022/0210953 A1 * | 6/2022 | Gao | H05K 7/20254 |
| 2022/0240421 A1 * | 7/2022 | Zhang | G06F 1/20 |
| 2022/0361376 A1 * | 11/2022 | Gao | H05K 7/20818 |

* cited by examiner

*Primary Examiner* — Courtney L Smith
(74) *Attorney, Agent, or Firm* — WOMBLE BOND DICKINSON (US) LLP

(57) ABSTRACT

A fluid distribution apparatus for servers mounted onto a rack. The apparatus includes one or more pairs of distribution units that are rotationally symmetric and are attached to each other to form the pair. Each of the distribution units includes a main supply port and main return port that are connected to the rack's fluid manifolds. Each of the distribution units also includes plurality of supply and return connectors that connect to the servers. A pump in each of the distribution units delivers fluid from the rack's fluid manifolds to the servers for cooling. Each server is connected to fluid ports on both distribution units, so as to provide full redundancy. A controller receives signals form the servers and sends operation signals to the pumps to control the fluid delivery for cooling the servers.

26 Claims, 10 Drawing Sheets

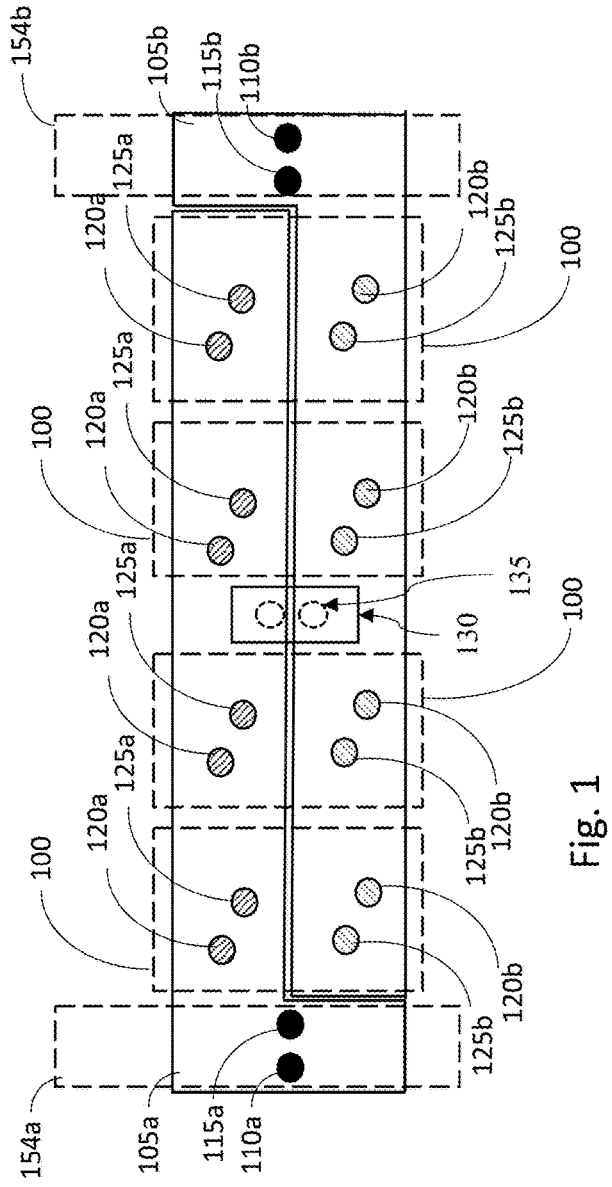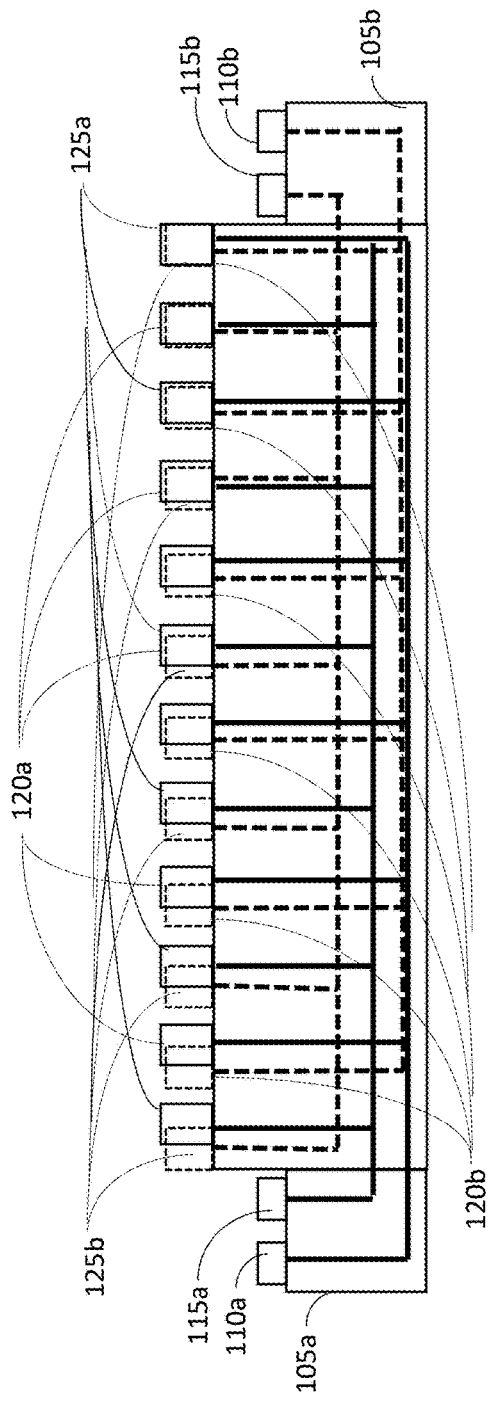

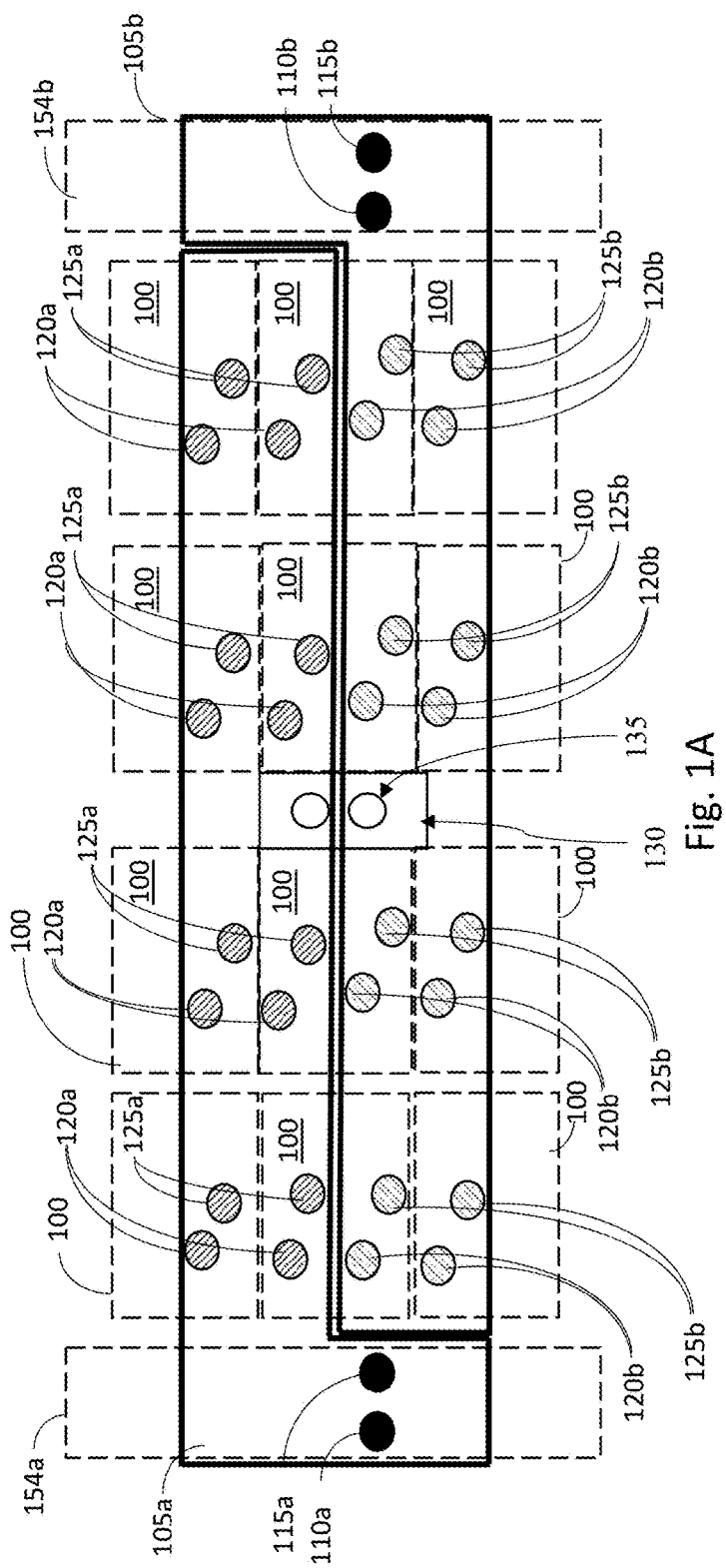
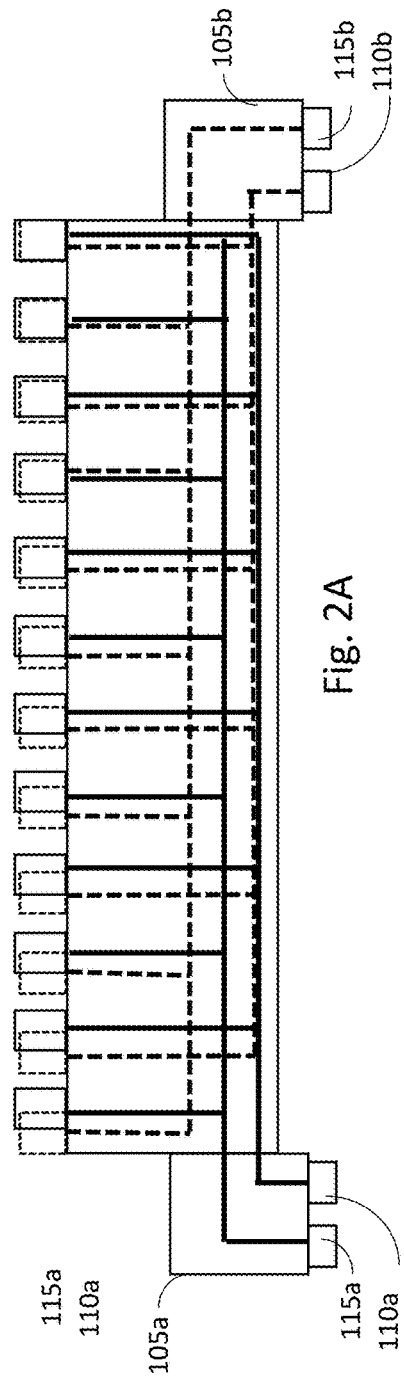
Fig. 1A
Fig. 2A

SYMMETRICAL DUAL FLUID DISTRIBUTION UNIT FOR SERVER RACK

FIELD OF THE INVENTION

Embodiments of the present invention relate generally to liquid cooling of servers, specifically to fluid distribution to servers in a server rack.

BACKGROUND

Server farms generally house rows of server racks, into which servers are mounted. Many advanced servers require liquid cooling, as simple air-based cooling is insufficient to properly remove the amount of heat generated by these servers. Consequently, various arrangements have been utilized for liquid-based cooling of the servers.

Many advanced chips, and especially high power density chips, require liquid cooling. These chips are exceedingly expensive, so that every effort needs to be taken to ensure proper heat removal from these chips. Prior art solutions for server liquid cooling includes only a single rack manifold attached on the rear side of the rack, either using manual mating or blind mating connectors. However, these solutions provide insufficient heat extraction for high power density racks. In addition, the solution may require complex control for fluid management, especially when attempting to incorporate redundancy in the liquid delivery.

BRIEF DESCRIPTION OF THE DRAWINGS

Embodiments of the invention are illustrated by way of example and not limitation in the figures of the accompanying drawings, which are not to scale and in which like references indicate similar elements.

FIG. 1 is a rear side view general diagram of a symmetrical fluid supply unit with redundancy, according to an embodiment, while FIG. 1A illustrates another embodiment of the symmetrical fluid supply unit with redundancy.

FIG. 2 is a top view schematic illustrating the main and sub-connectors arrangement according to an embodiment, while FIG. 2A is a top view schematic illustrating the main and sub-connectors according to another embodiment.

DETAILED DESCRIPTION

Figure 3:
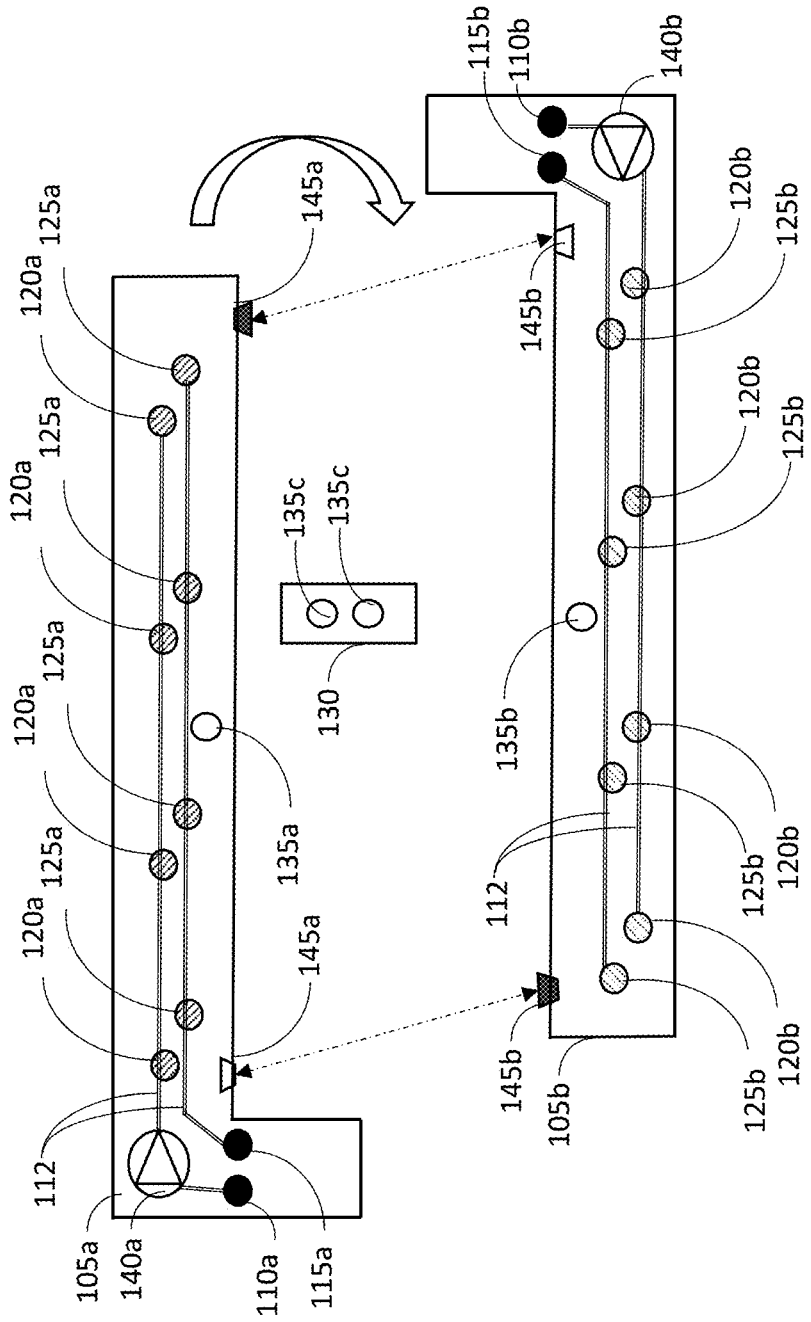
FIG. 3 illustrates an exploded view of an embodiment prior to assembly.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Incidentally, in the following embodiments similar elements are identified with similar reference numbers in the formal x##, wherein the first digit x is replaced by the same digit as the figure number, while the next two digits ## are maintained consistent among the embodiments. Consequently, explanation of previously disclosed elements may not be repeated in subsequent embodiments.

Disclosed embodiments provide a rack architecture with a symmetrical fluid unit for liquid cooled high power density racks. The design includes a built-in control feature for efficient fluid management in standard and redundant scenarios. Disclosed embodiments solve the high power density server and rack liquid cooling design challenges, especially the fluid management on both the hardware design and control. With these new designs, efficient fluid distribution and management are enabled, which can accommodate different server and rack architectures. Moreover, full redundancy of fluid supply is implemented with efficient and effective control for fluid recirculation.

For better support of constant growth in artificial intelligence (AI), Cloud computing, and Big data, high performance computing is becoming increasingly important. These high performance computing systems impose corresponding efficient thermal management and energy management challenges. One key focus for solving these challenges is advanced design of the cooling solution.

According to disclosed embodiments, two identical sections are assembled together for fluid distribution and management. Each section includes one set of fluid main connectors and one or more sub-connectors. In an embodiment, the connectors are packaged on the same side and in another embodiment, the connectors are packaged on the opposite sides. The internal design of each section includes fluid loops connecting and distributing the fluid between the connectors. In addition, communication ports are included for controlling the internal pumps with the measurement of the server power consumption. The control module is attached to the symmetrical module, including communication port connection. The rack includes the two sets of manifolds packaged on the rear side facing the rear side of the rack and the fluid distribution unit is populated to the rack from the rear side connecting with the manifold.

As exemplified by the embodiments disclosed below, the rack architecture can be easily tailored to fit different connectors arrangement for the distribution units. Depending on the rack manifold used, different connector arrangement can be chosen to easily connect the distribution units to the manifolds and servers and provide efficient liquid delivery. Moreover, using the disclosed fluid distribution units full redundancy can be implemented for liquid heat removal, thus avoiding server interruption in case of a failure of one unit or a need to service one unit.

According to one aspect, an apparatus for fluid distribution for cooling servers includes a first fluid distribution unit having a pump, a main supply port, a main return port, a plurality of supply sub-ports and a plurality of return sub-ports, a second fluid distribution unit having a pump, a main supply port, a main return port, a plurality of supply sub-ports and a plurality of return sub-ports, the first and second fluid distribution units further having a mating mounting elements for mounting the first and second fluid distribution units to each other, and wherein the first and second fluid distribution units are symmetrical.

According to another aspect, a server rack apparatus includes a rack having a plurality of slots for accepting a plurality of servers in multiple vertical levels, a first supply manifold and a first return manifold, a second supply manifold and a second return manifold, at least one first fluid distribution unit attached to a rear side of the rack and having a pump, a main supply port fluidly coupled to the first supply manifold, a main return port fluidly coupled to the first return manifold, a plurality of supply sub-ports fluidly coupled to the servers, and a plurality of return sub-ports fluidly coupled to the servers, and at least one second fluid distribution unit attached to the rear side of the rack and having a pump, a main supply port fluidly coupled to the second supply manifold, a main return port fluidly coupled to the second return manifold, a plurality of supply sub-ports fluidly coupled to the servers, and a plurality of return sub-ports fluidly coupled to the servers. Each of the servers is coupled to one supply sub-port and one return sub-port of the first fluid distribution unit and to one supply sub-port and one return sub-port of the second fluid distribution unit.

FIG. 1 is a general diagram showing rear view of a symmetrical fluid supply unit with redundancy, according to an embodiment. The arrangement includes two sections 105a and 105b, also referred to as fluid distribution units, Section I and Section II, which are rotationally symmetrical at 180° rotation. The two sections are configured to nest together when assembled to the rack, thereby providing redundant supply and return for cooling fluids. In this particular example each of sections 105a and 105b has a housing formed in an L-shape, but housing of other shapes may be implemented so as to be rotationally symmetrical and nest within each other. All of the connectors that are described below are illustrated in FIG. 1, although by reference to the top view FIG. 2, one can understand that in actuality the connectors are on the opposite side as shown in FIG. 1, i.e., into the page.

Each of the two sections 105a and 105b has main connectors: main supply 110a 110b and main return 115a 115b; and a plurality of sub-connectors: sub-supply 120a 120b and sub-return 125a 125b. Each of the two sections 105a and 105b is configured to be mounted on the rack in a horizontal orientation and when the two sections are nested together, the main connectors of the two sections are at the same height, thus simplifying the rack side manifold design. When the distribution units 105a and 105b are mounted onto the rack, the main supply and return connectors 110a, 110b, 115a and 115b, are connected to the rack's main distribution manifolds 154a and 154b. The servers 100 are indicated in dashed lines, showing that each server 100 has one supply and one return connection to each of the two sections 105a and 105b. This implementation ensures full redundancy.

Controller 130 is attached in the middle of the paired distribution units. The connection includes both the mechanical connection (not shown) and communication ports 135 (shown in dotted line as they are in the back and would be obscured from view in this angle). In disclosed embodiments the controller may be kept operational on either one of the paired distribution units, while the other unit is removed for service or replacement. For example, if the unit 105a failed and needs to be replaced, it can be removed from the rack from rear side and unit 105b can keep working on the rack with the controller operational on unit 105b.

FIG. 2 is a top view illustrating an arrangement of the main connectors and the sub-connectors according to an embodiment. All of the connectors in this embodiment face the same side, i.e., units 105a and 105b are attached at the back of the rack and all of the connectors are facing the rack and the servers mounted on the rack. As shown, each server would receive an inlet and outlet connectors from unit 105a, and an inlet and outlet connectors from unit 105b, providing full redundancy. For clarity, all mechanical elements of units 105a and 105b are omitted from FIG. 1, as well as the controller and its communication elements.

In the embodiment of FIG. 1, each of the two units 105a and 105b has one row of sub-connectors, i.e., sub-supply 120a, 120b and sub-return 125a, 125b. Thus, each of the two units 105a and 105b can be connected to only one row of servers. FIG. 1A illustrates an embodiment wherein each of the two units 105a and 105b has two rows of sub-connectors, i.e., sub-supply 120a 120b and sub-return 125a 125b. Consequently, each of the two units 105a and 105b can be connected to two row of servers. In the illustration of FIG. 1A, three rows of servers are shown, stacked on top of each other. One row of sub-supply 120a and sub-return 125a of section 105a is shown being connected to the servers in the top row, while a second row of sub-supply 120a and sub-return 125a of section 105a is shown being connected to the servers in the middle row. Also, one row of sub-supply 120b and sub-return 125b of section 105b is shown being connected to the servers in the middle row, while a second row of sub-supply 120b and sub-return 125b of section 105b is shown being connected to the servers in the bottom row. By this arrangement, each of the two sections 105a and 105b serves two rows of servers on two different elevation levels.

FIG. 2A is a top view illustrating an arrangement of the main connectors and the sub-connectors according to another embodiment. The arrangement of the internal pipes and pump is the same as in other embodiments disclosed herein, especially the embodiment of FIG. 2, except that the main connectors are provided on the side opposite that of the sub-connectors. This enables implementing the fluid distribution while connecting the main connectors to a manifold positioned at the back of the distribution units, as will be shown further below.

FIG. 3 is an exploded view of the arrangement according to an embodiment, wherein each of the two units 105a and 105b has one row of sub-connectors, but similar arrangement can be made wherein each of the two units 105a and 105b has two rows of sub-connectors, as in FIG. 1A. FIG. 3 shows distribution unit 105a, distribution unit 105b and the controller prior to assembly. As indicated by the curved arrow, a 180 degrees rotation of distribution unit 105a, would yield distribution unit 105b, i.e., they are rotationally symmetrical. distribution unit 105a incorporates the main connectors, 110a and 115a, sub-connectors 120a and 125a, a communication port 135a, and a pump 140a. distribution unit 105b incorporates the identical elements, i.e., main connectors, 110b and 115b, sub-connectors 120b and 125b, a communication port 135b, and a pump 140b. The controller 130 includes complementary communication ports 135c for each of distribution units 105a and 105b.

Each of distribution unit 105a and distribution unit 105b also include mating mounting elements 145a and 145b. As exemplified by the dash-dot arrows, these mating mounting elements are configured to attach distribution unit 105a and distribution unit 105b to each other. According to an embodiment, distribution unit 105a and distribution unit 105b are first attached to each other using the mating mounting elements and then the controller 130 is attached to the paired distribution unit 105a and distribution unit 105b.

Also, as exemplified by pipes 112, the sub-connectors 120a and 125a are internally connected by pipes to the main connectors, 110a and 115a, wherein the pipe leading to the supply connectors 120a pass through the pump 140a. Similarly, the sub-connectors 120b and 125b are internally connected to the main connectors, 110b and 115b, wherein the pipe leading to the supply connectors 120b pass through the pump 140b.

Figure 4:
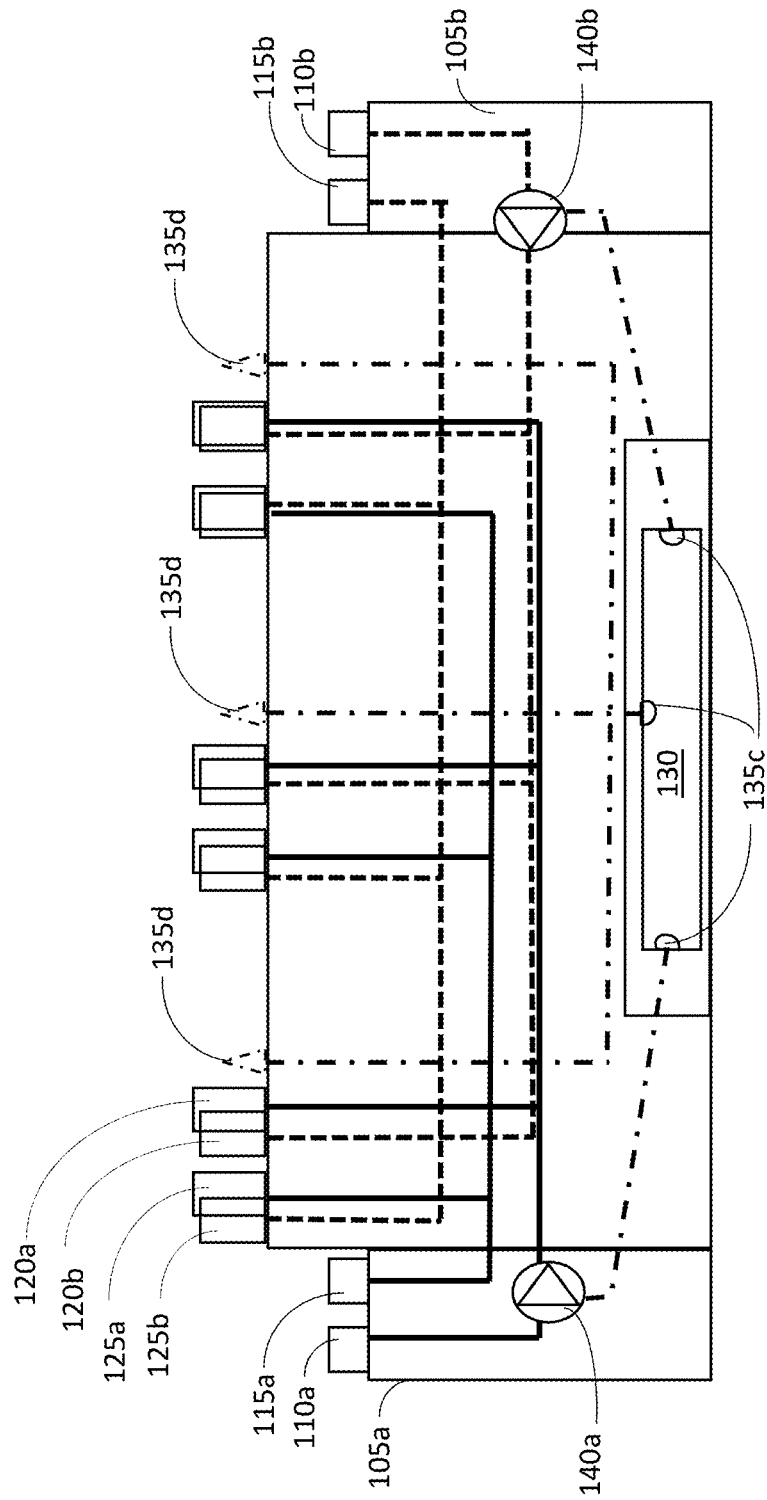
FIG. 4 is a schematic illustration showing the control feature implemented in an embodiment.

FIG. 4 is a schematic illustration showing the control feature implemented in an embodiment. The schematic illustrates both the fluid connectors and lines (solid and dash lines) and the communication ports and lines (dash-dot lines). All of the fluid and communication ports are provided on the same side of the units for easy connections to the servers. The communication ports 135d are designed to be connected with each individual server populated in the rack, thus providing communication path to the controller 130.

Among the communications received by the controller 130 from ports 135d is a signal indicative of the power consumption of each server. In one embodiment, the signal from port 135d is a measurement information of the temperature inside of the server. Each of the distribution unit 105a and distribution unit 105b includes an acceleration pump, 140a and 140b, fluidly coupled between the main supply (110a and 110b) and the sub-supplies (120a and 120b). The acceleration pumps 140a and 140b also have communication lines connected with the controller 130. The operational speed of the pumps is controlled by the controller 130, taking into account the information the controller 130 receives from the servers via the commination ports. The controller also receives signals from the pumps to determine the pumps' operation status. For example, if one pump idles or is disconnected from the rack, the controller receives corresponding signal and may send instructions to another pump to accelerate so as to compensate for the stopped pump.

Figure 5:
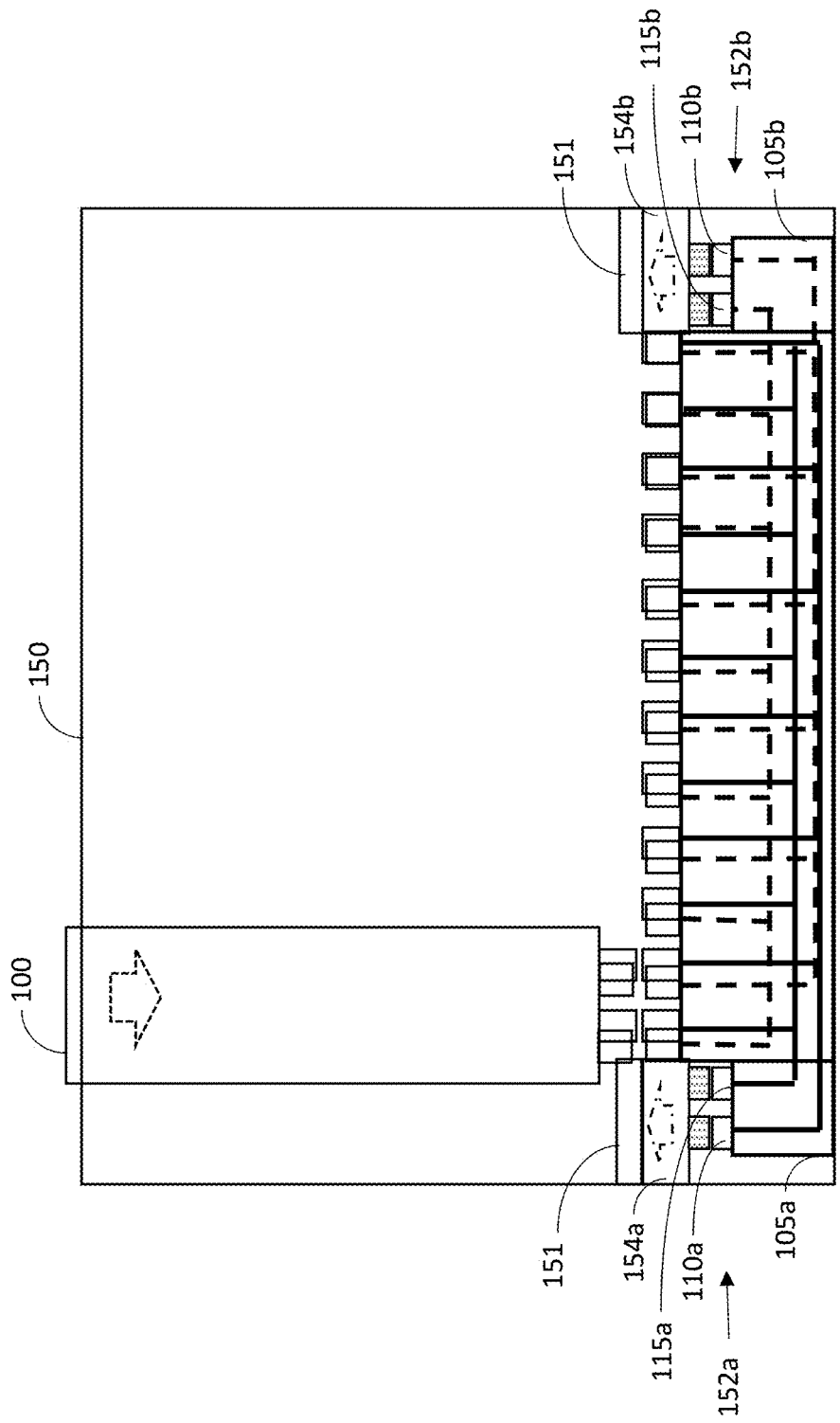
FIG. 5 illustrates an embodiment having the fluid circulation arrangement mounted onto a server rack.

FIG. 5 is a top view that illustrates an embodiment having the fluid circulation arrangement mounted onto a server rack. The distribution unit 105a and distribution unit 105b are mounted on the backside of rack 150, wherein servers 100 are loaded from the front side of the rack 150, are illustrated by the dotted arrow. The backside of the rack 150 has two mounting areas 152a and 152b for mounting and servicing the two distribution units 105a and 105b. The mounting spaces also incorporate main distribution manifolds 154a and 154b. When the distribution units 105a and 105b are mounted onto the rack, the main supply and return connectors 110a, 110b, 115a and 115b, are connected to the main distribution manifolds 154a and 154b. Then, when a server 100 is mounted from the front side (see dotted arrow), the sub-connectors are aligned and connect directly to the fluid ports of server 100. Also, the communication port is connected for communication between the server and the controller (not shown).

Another feature illustrated in FIG. 5 is the provision of service space 151, for the removal and service of main distribution manifolds 154a and 154b. Specifically, on occasion it may be necessary to remove or replace one of main distribution manifolds 154a and 154b. The inclusion of service space 151 allows for the disconnect and removal/replacement of a main distribution manifolds without disturbing the distribution units 105a and 105b. As illustrated by the dash-dot arrow, the service space 151 allows for pulling back the manifold for disconnection and removal from the distribution units 105a and 105b. Without providing the service space, one would be required to remove the distribution units 105a and 105b in order to remove one of the main distribution manifolds 154a and 154b, which would mean shutting down all of the severs. Here, since the distribution units 105a and 105b can remain in place and supply cooling, the servers may continue to operate while the manifold is replaced.

Figure 6:
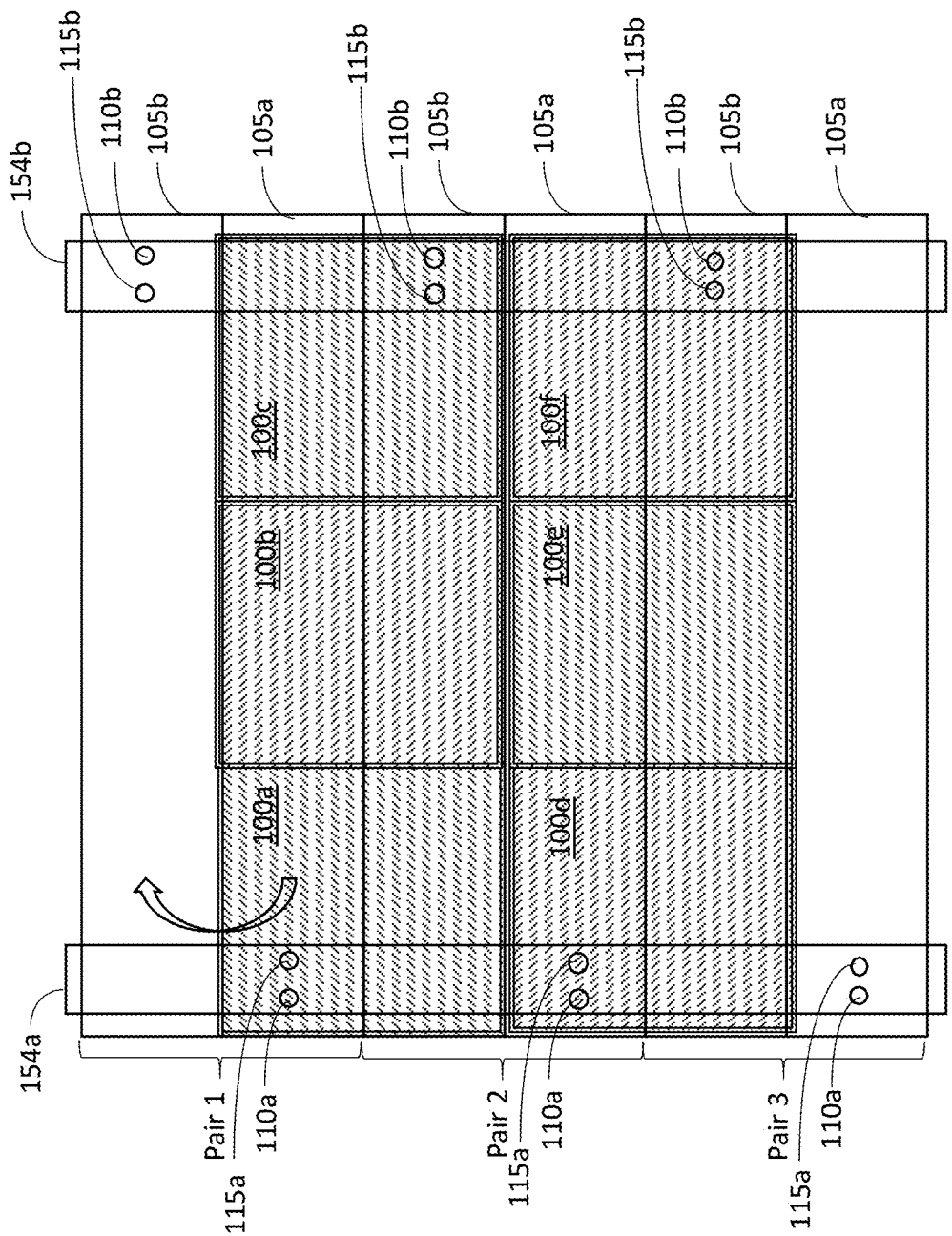
FIG. 6 illustrates rear side view of a rack level design according to an embodiment, wherein the main connectors are at different vertical levels.

FIG. 6 is a conceptual diagram illustrating a rack level design according to an embodiment. In this embodiment, three pairs of redundant distribution units 105a and 105b are shown, indicated as pair 1, pair 2, and pair 3. Unlike the embodiment of FIG. 1, in this embodiment the main connectors 110a, 115a of distribution unit 105a is at a vertically different level than the main connectors 110b, 115b of the paired distribution unit 105b. To accommodate such design, the main ports on the main distribution manifolds 154a and 154b are also at different vertical levels, to match the main ports on the distribution units 105a and 105b.

At the condition shown in FIG. 6, the rack 160 is populated with six servers arranged in two rows: servers 100a, 100b and 100c are in top row and servers 100d, 100e and 100f in the bottom row. In this particular arrangement the server rows are staggered, such that each server is connected to a distribution unit from a different pair. For example, servers 100a, 100b and 100c of the top row are connected to distribution unit 105a of pair 1, but also connected to distribution units 105b of pair 2. Similarly, servers 100d, 100e and 100f of the bottom row are connected to distribution unit 105a of pair 2, but also connected to distribution units 105b of pair 3.

From the illustration of FIG. 6 it is possible to see the flexibility of the design without losing full redundancy. For example, servers 100a, 100b, and 100c could have been installed on one rack space up and still be connected to two different distribution unit. If servers 100a, 100b, and 100c were to be moved one space up, as illustrated by the curved arrow, then each would have been connected to distribution units 105a and 105b of Pair 1. Servers 100d, 100e and 100f could remain at the same location, moved up, or moved down and still be connected to two different distribution units.

For clarity, the drawing presents the various elements in a somewhat transparent manner, so that the reader can see all of the relevant part. For example, from the presented view point the main supply and return connectors 110a, 110b, 115a and 115b would not be visible, but are nevertheless shown to help with understanding of the embodiment. Also, while any of the distribution units 105a and 105b disclosed herein can be used in the embodiment of FIG. 6, this specific embodiment utilizes the distribution units 105a and 105b illustrated in FIG. 2A, wherein the main connectors are on opposite side than the sub-connectors. This enables to place the manifolds at the back of the distribution units 105a and 105b (see also FIG. 8), such that adjacent racks can be placed abating each other for higher density of racks within the allotted floor space.

Figure 7:
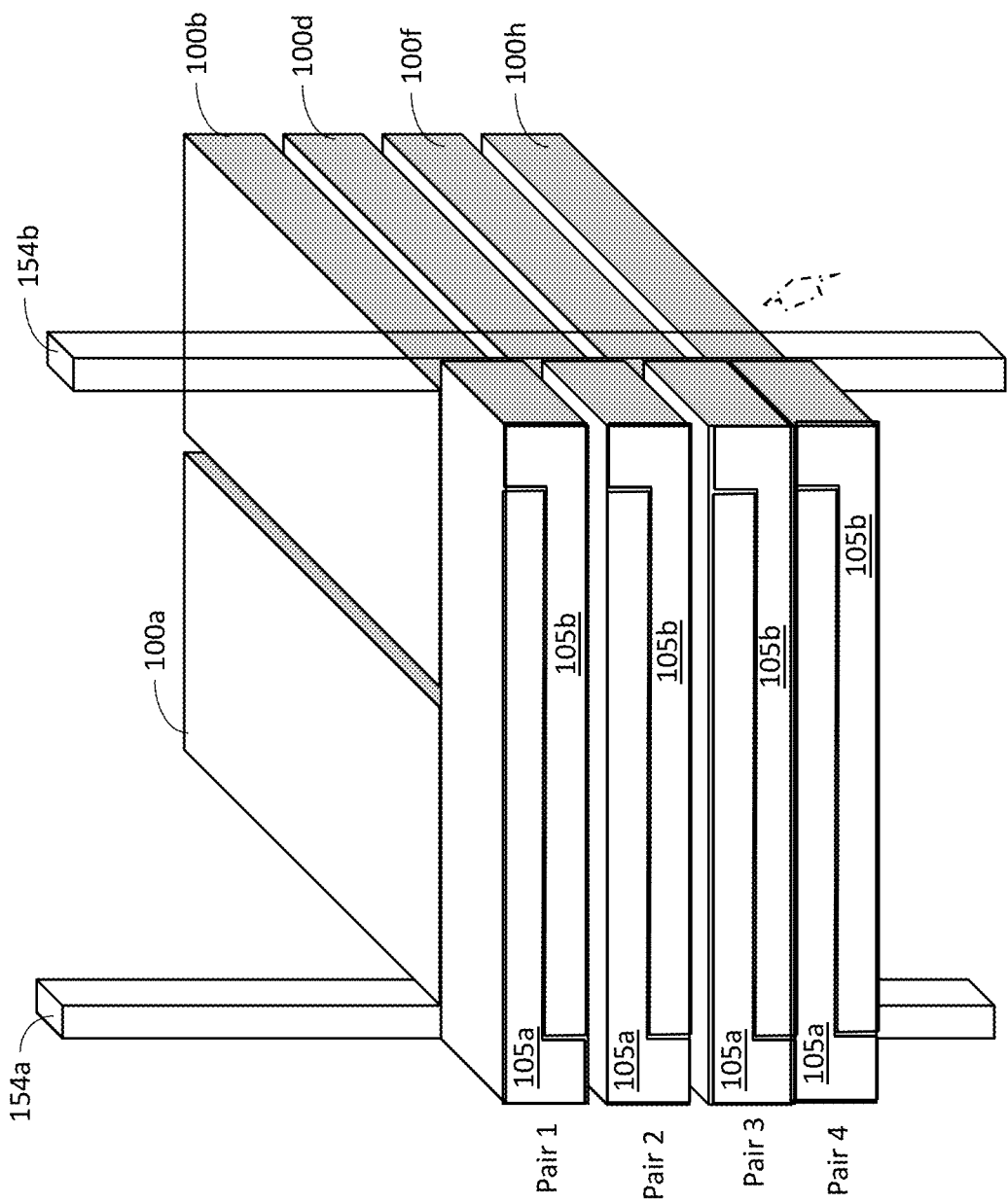
FIG. 7 illustrates a rack level design according to an embodiment, wherein the main connectors are at the same vertical level.

FIG. 7 is a conceptual diagram illustrating a rack level design according to another embodiment. In this embodiment, four pairs of redundant distribution units 105a and 105b are shown, indicated as pair 1, pair 2, pair 3 and pair 4. This embodiment utilizes nesting pairs similar to that shown in FIG. 1, wherein the main connectors are at the same level. Also, each distribution unit has only one row of sub-connectors. The rack is populated with eight servers, arranged in four levels of two servers in each level. In this embodiment, the servers are aligned to the distribution units pairs, rather than being staggered, such that each server is connected to distribution units belonging to the same pair. For example, servers 100a and 100b are connected to distribution units 105a and 105b belonging to pair 1, while servers 100c and 100d are connected to distribution units 105a and 105b belonging to pair 2.

Also, in FIG. 7 the main distribution manifolds 154a and 154b are provided besides the servers, thus having sufficient service access to remove a manifold without disturbing the distribution units 105a and 105b, as shown by the arrow.

Figure 8:
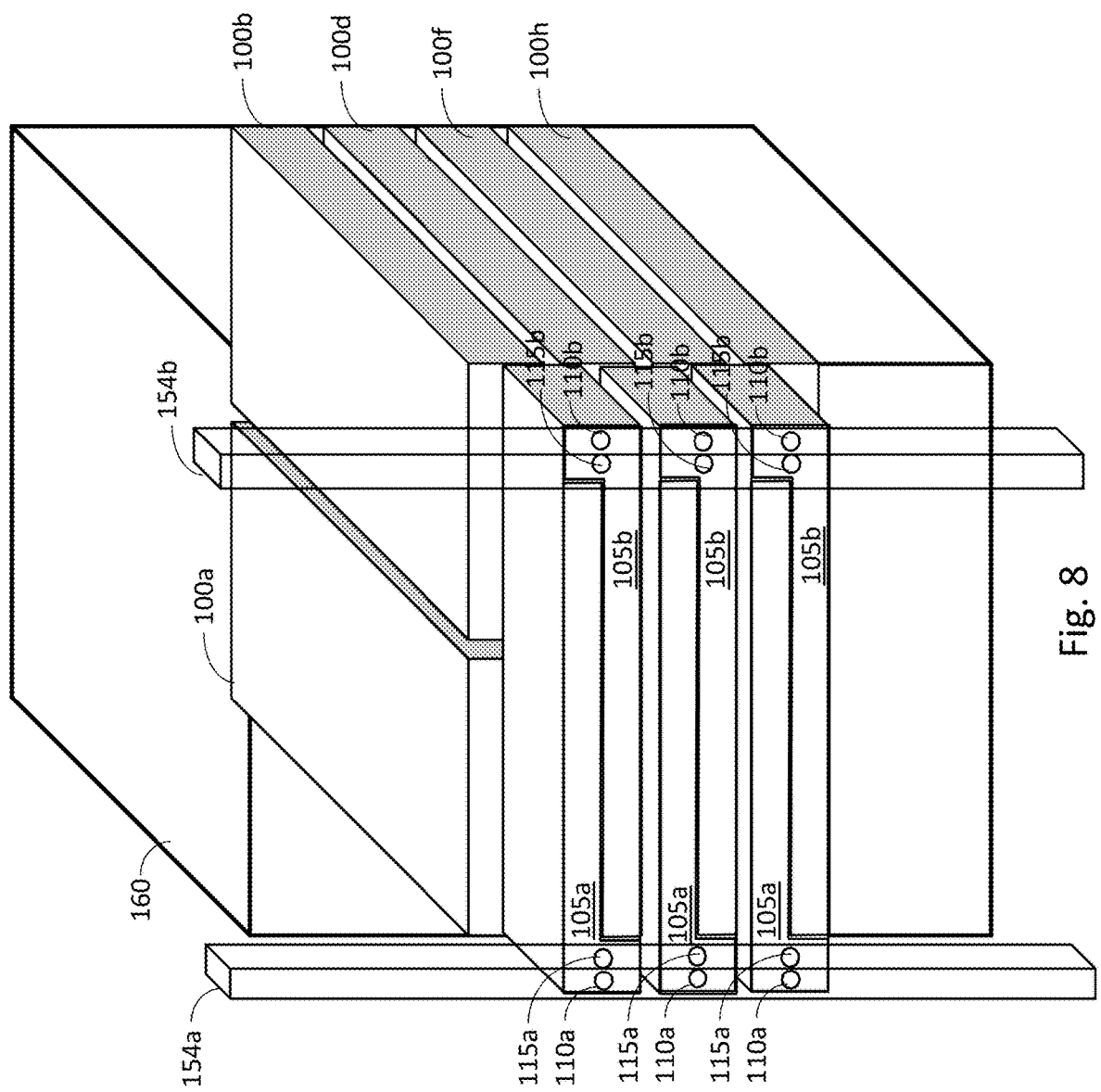
FIG. 8 is a conceptual diagram illustrating a rack level design according to another embodiment.

FIG. 8 is a conceptual diagram illustrating a rack level design according to yet another embodiment. The overall design is similar to that of FIG. 7, except that each of the distribution units 105a and 105b has the main connectors and sub-connectors on opposite sides, as shown in, e.g., FIG. 2A. Therefore, the main manifolds are provided on the rear side of the distribution units 105a and 105b. Also, the arrangement is staggered, similar to what is shown in FIG. 6. Consequently, servers 100a and 100b are connected to the top distribution unit 105a. However, the paired distribution unit 105b is connected to servers 100c and 100d. Servers 105c and 105d are also connected to the sub-connectors of distribution units 105a of the second pair. Thus, each of distribution units 105a and 105b of a paired distribution units is connected to different servers on different level on the rack.

Figure 9:
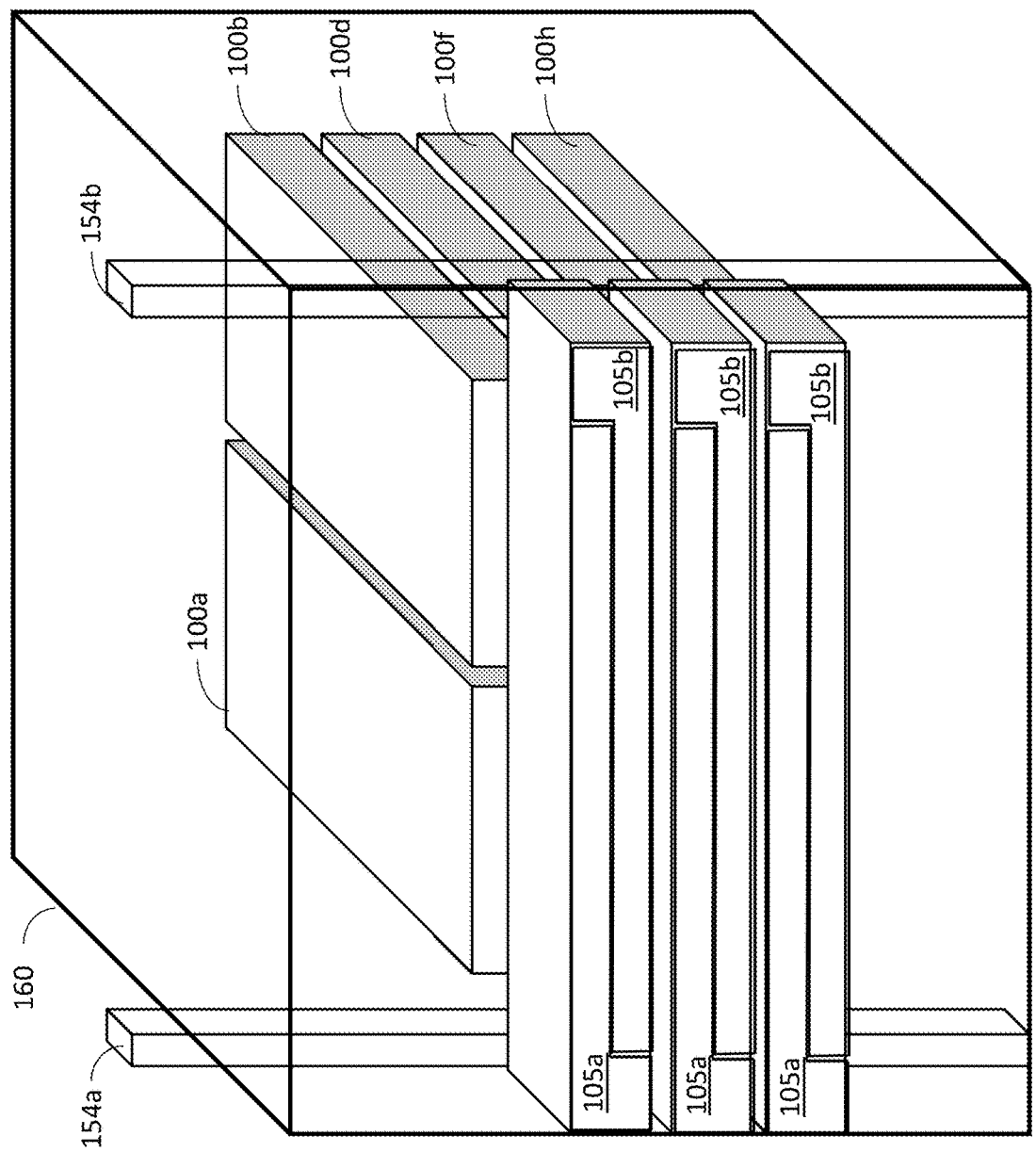
FIG. 9 is a conceptual diagram illustrating a rack level design according to further embodiment.

FIG. 9 is a conceptual diagram illustrating a rack level design according to a further embodiment. The overall design is similar to that of FIG. 8, except for the position of the main connectors of the distribution units and the position of the main distribution manifolds 154a and 154b. Specifically, each of the distribution units 105a and 105b has both the main connectors and the sub-connectors on the same side, since the main connectors have to face the corresponding connectors on the distribution manifolds 154a and 154b, while the sub-connectors have to face the corresponding connectors of the servers. In FIG. 9 the main connectors connect to the corresponding connectors on the distribution manifolds 154a and 154b which are positioned on the side of the rack 160.

Note that in all of the disclosed embodiments all of the fluid connectors may be blind mate, no-drip, quick connect, or any other suitable connectors. For ease of installation and servicing, blind-mate no-drip connectors are beneficial. Using the blind-mate no-drip connectors, the servers may be simply slide from the front of the rack and automatically align and connect to the sub-connectors of the distribution units. Also, when pulling the server, the connectors will disconnect and will not drip.

Figure 10:
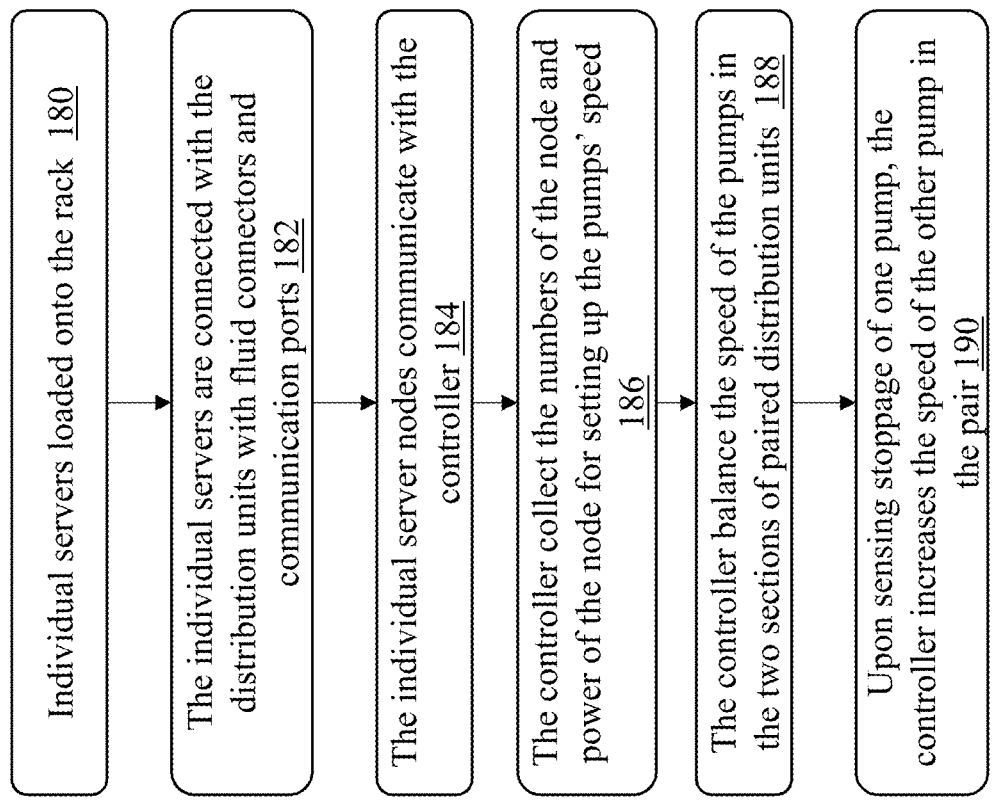
FIG. 10 is a block diagram for implementing a disclosed embodiment.

FIG. 10 is a general block flow diagram illustrating an operation of an embodiment. In block 180 servers are loaded onto the rack. In block 182, each server is connected to the fluid sub-connectors of paired distribution units and to the communication port of the controller. In block 184 during operation each server communicates with the controller and sends to the controller operational data, including power consumption data. In block 186 the controller analyzes the data received from the server and based on the analysis sets the speed of the pump in each of the distribution units. In block 188, for each two paired distribution units, the controller balances the operational speed of the pumps according to the power consumption of the server connected to the pair. In block 190, if the controller senses a stoppage of one of the pumps in a paired distribution units, e.g., do to failure or disconnection, the controller increases the speed of the pump in the other paired distribution unit to compensate.

In the embodiments disclosed above, each server is connected to two distribution units 105a and 105b, which was described as full redundancy. However, the connection of each server to two distribution units can also be used to service different cooling requirements of different devices. For example, one of the distribution units 105a and 105b can circulate chilled water for heat removal, while the other of distribution units 105a and 105b can circulate a two phase liquid or any other engineered liquid designed for high heat removal capacity. In such an implementation, some devices on the server would be cooled by standard water-cooled cooling plate, while higher performance devices may be cooled by two-phase or other high capacity heat removal arrangements.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An apparatus for fluid distribution for cooling servers, comprising:
a first fluid distribution unit having a pump, a main supply port, a main return port, a plurality of supply sub-ports and a plurality of return sub-ports, wherein each supply sub-port is paired with a corresponding return sub-port and wherein at least one supply sub-port and the corresponding return sub-port are adapted to be fluidly coupled to a corresponding server;
a second fluid distribution unit having a pump, a main supply port, a main return port, a plurality of supply sub-ports and a plurality of return sub-ports, wherein each supply sub-port is paired with a corresponding return sub-port and wherein at least one supply sub-port and the corresponding return sub-port are adapted to be fluidly coupled to a corresponding server;
the first and second fluid distribution units further having a mating mounting elements for mounting the first and second fluid distribution units to each other, and wherein the first and second fluid distribution units are symmetrical.

2. The apparatus of claim 1, wherein each of the main supply ports and the main return ports are configured for connection to a rack manifold.

3. The apparatus of claim 2, further comprising a controller and wherein each of the first and second fluid distribution units further comprises a communication port coupled to the controller.

4. The apparatus of claim 3, wherein the controller further comprises communication ports coupled to the servers.

5. The apparatus of claim 1, wherein in each of the first and second fluid distribution units, the plurality of supply sub-ports are arranged in a single row and the plurality of return sub-ports are arranged in a single row.

6. The apparatus of claim 1, wherein in each of the first and second fluid distribution units, the plurality of supply sub-ports are arranged in two rows and the plurality of return sub-ports are arranged in two rows.

7. The apparatus of claim 1, wherein each of the supply sub-ports and return sub-ports comprises a blind-mating fluid connector.

8. A server rack apparatus, comprising:
a rack having a plurality of slots for accepting a plurality of servers in multiple vertical levels;
a first supply manifold and a first return manifold;
a second supply manifold and a second return manifold;
at least one first fluid distribution unit attached to a rear side of the rack and having a pump, a main supply port fluidly coupled to the first supply manifold, a main return port fluidly coupled to the first return manifold, a plurality of supply sub-ports fluidly coupled to the servers, and a plurality of return sub-ports fluidly coupled to the servers; and,
at least one second fluid distribution unit attached to the rear side of the rack and having a pump, a main supply port fluidly coupled to the second supply manifold, a main return port fluidly coupled to the second return manifold, a plurality of supply sub-ports fluidly coupled to the servers, and a plurality of return sub-ports fluidly coupled to the servers;
wherein each of the servers is coupled to one supply sub-port and one return sub-port of the first fluid distribution unit and to one supply sub-port and one return sub-port of the second fluid distribution unit.

9. The apparatus of claim 8, comprising a plurality of first fluid distribution units and a plurality of second fluid distribution units, and wherein each one of the plurality of first fluid distribution units is mated to a corresponding one of the plurality of second fluid distribution units to form paired fluid distribution units.

10. The apparatus of claim 9, wherein each of the plurality of first fluid distribution units and the plurality of second fluid distribution units has the supply sub-ports arranged into upper row and lower row, and the return sub-ports arranged into upper row and lower row.

11. The apparatus of claim 10, for each of the plurality of first fluid distribution units and the plurality of second fluid distribution units, the upper row of the supply sub-ports is connected to servers in a first level, and the lower row of the supply sub-ports is connected to servers in a second level, and the upper row of the return sub-ports is connected to servers in the first level, and the lower row of the return sub-ports is connected to servers in the second level.

12. The apparatus of claim 9, wherein each of the plurality of first fluid distribution units and the plurality of second fluid distribution units has the supply sub-ports arranged into a single row, and the return sub-ports arranged into a single row.

13. The apparatus of claim 12, wherein each paired fluid distribution units is fluidly connected to servers in a single level.

14. The apparatus of claim 8, further comprising a controller coupled in electrical communication with the servers and providing operational signal to the pumps.

15. The apparatus of claim 8, wherein the first supply manifold and the first return manifold are attached onto one side of the rack and the second supply manifold and the second return manifold are attached to an opposite side of the rack.

16. The apparatus of claim 8, wherein the first fluid distribution unit and the second fluid distribution unit are rotationally symmetrical.

17. A method of providing fluid distribution in a server rack, comprising:
attaching together a first fluid distribution unit and a second fluid distribution unit to form a paired fluid distribution unit;
attaching the paired fluid distribution unit to back of the rack;
connecting main supply port of the first fluid distribution unit to a first main supply manifold;
connecting main return port of the first fluid distribution unit to a first main return manifold;
connecting main supply port of the second fluid distribution unit to a second main supply manifold;
connecting main return port of the second fluid distribution unit to a second main return manifold;
connecting supply sub-ports of the first fluid distribution unit to a plurality of servers;
connecting supply sub-ports of the second fluid distribution unit to the plurality of servers;
connecting return sub-ports of the first fluid distribution unit to the plurality of servers; and,
connecting return sub-ports of the second fluid distribution unit to the plurality of servers.

18. The method of claim 17, wherein each of the first fluid distribution unit and the second fluid distribution unit comprises a pump; the method further comprising sending status data from the servers to a controller and operating the controller to issue operational signals to the pumps.

19. The method of claim 18, wherein the status data includes power consumption and the operational signals include speed signal.

20. The method of claim 17, wherein connecting supply sub-ports of the first fluid distribution unit to a plurality of servers comprises connecting the supply sub-ports to servers arranged in two rows at two vertical levels.

21. An apparatus for fluid distribution for cooling servers, comprising:
a first fluid distribution unit having a pump, a main supply port, a main return port, a plurality of supply sub-ports and a plurality of return sub-ports;
a second fluid distribution unit having a pump, a main supply port, a main return port, a plurality of supply sub-ports and a plurality of return sub-ports;
the first and second fluid distribution units further having a mating mounting elements for mounting the first and second fluid distribution units to each other, and wherein the first and second fluid distribution units are symmetrical;
wherein each of the supply sub-ports and return sub-ports comprises a blind-mating fluid connector.

22. The apparatus of claim 21, wherein each of the main supply ports and the main return ports are configured for connection to a rack manifold.

23. The apparatus of claim 22, further comprising a controller and wherein each of the first and second fluid distribution units further comprises a communication port coupled to the controller.

24. The apparatus of claim 23, wherein the controller further comprises communication ports coupled to the servers.

25. The apparatus of claim 21, wherein in each of the first and second fluid distribution units, the plurality of supply sub-ports are arranged in a single row and the plurality of return sub-ports are arranged in a single row.

26. The apparatus of claim 21, wherein in each of the first and second fluid distribution units, the plurality of supply sub-ports are arranged in two rows and the plurality of return sub-ports are arranged in two rows.

* * * * *